US007282916B2

(12) United States Patent
Eberlein et al.

(10) Patent No.: US 7,282,916 B2
(45) Date of Patent: *Oct. 16, 2007

(54) TIME-VARIABLE MAGNETIC FIELDS GENERATOR AND MAGNETIC RESONANCE APPARATUS EMBODYING SAME

(75) Inventors: Eva Eberlein, Baiersdorf (DE); Matthias Gebhardt, Oxford (GB); Wolfgang Renz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 32 days.

This patent is subject to a terminal disclaimer.

(21) Appl. No.: 11/126,458

(22) Filed: May 11, 2005

(65) Prior Publication Data

US 2005/0258832 A1   Nov. 24, 2005

(30) Foreign Application Priority Data

May 14, 2004  (DE) .................. 10 2004 024 098

(51) Int. Cl.
*G01V 3/00* (2006.01)
(52) U.S. Cl. ..................................... 324/318
(58) Field of Classification Search ........ 324/300–322; 600/410–435
See application file for complete search history.

(56) References Cited

U.S. PATENT DOCUMENTS

| 5,166,619 | A | 11/1992 | Ries |
| 5,467,017 | A | 11/1995 | Duerr et al. |
| 5,512,828 | A | 4/1996 | Pausch et al. |
| 5,581,187 | A | 12/1996 | Pausch |
| 6,335,670 | B1 * | 1/2002 | Kinanen ..................... 335/296 |
| 6,433,550 | B1 | 8/2002 | Kinanen |
| 6,538,545 | B2 * | 3/2003 | Wakuda et al. ............. 335/296 |
| 6,747,453 | B2 | 6/2004 | Nistler et al. |
| 7,026,816 | B2 * | 4/2006 | Gebhardt et al. ........... 324/318 |
| 7,057,391 | B1 * | 6/2006 | Tanabe ........................ 324/318 |
| 2005/0068032 | A1 * | 3/2005 | Harvey et al. .............. 324/318 |

FOREIGN PATENT DOCUMENTS

DE   195 44 779 A1   6/1997

* cited by examiner

*Primary Examiner*—Diego Gutierrez
*Assistant Examiner*—Dixomara Vargas
(74) *Attorney, Agent, or Firm*—Schiff Hardin LLP

(57) ABSTRACT

A generator of time-variable magnetic fields generator for a magnetic resonance apparatus has a primary gradient coil unit for generating of a gradient magnetic field in an examination region of the magnetic resonance apparatus. The primary gradient coil unit, for accommodating at least one gradient coil conductor, has a central region, an outer region and at least one connecting region connecting the two regions. The outer region surrounds the central region. At least one intervening space is disposed between the central region and the outer region. The intervening space is free of the gradient coil conductors of the primary gradient coil unit and a radio frequency antenna element is disposed therein. Such a generator enables an effective gradient field and RF field generation in a compact design combining a gradient coil and a radio-frequency antenna.

18 Claims, 6 Drawing Sheets

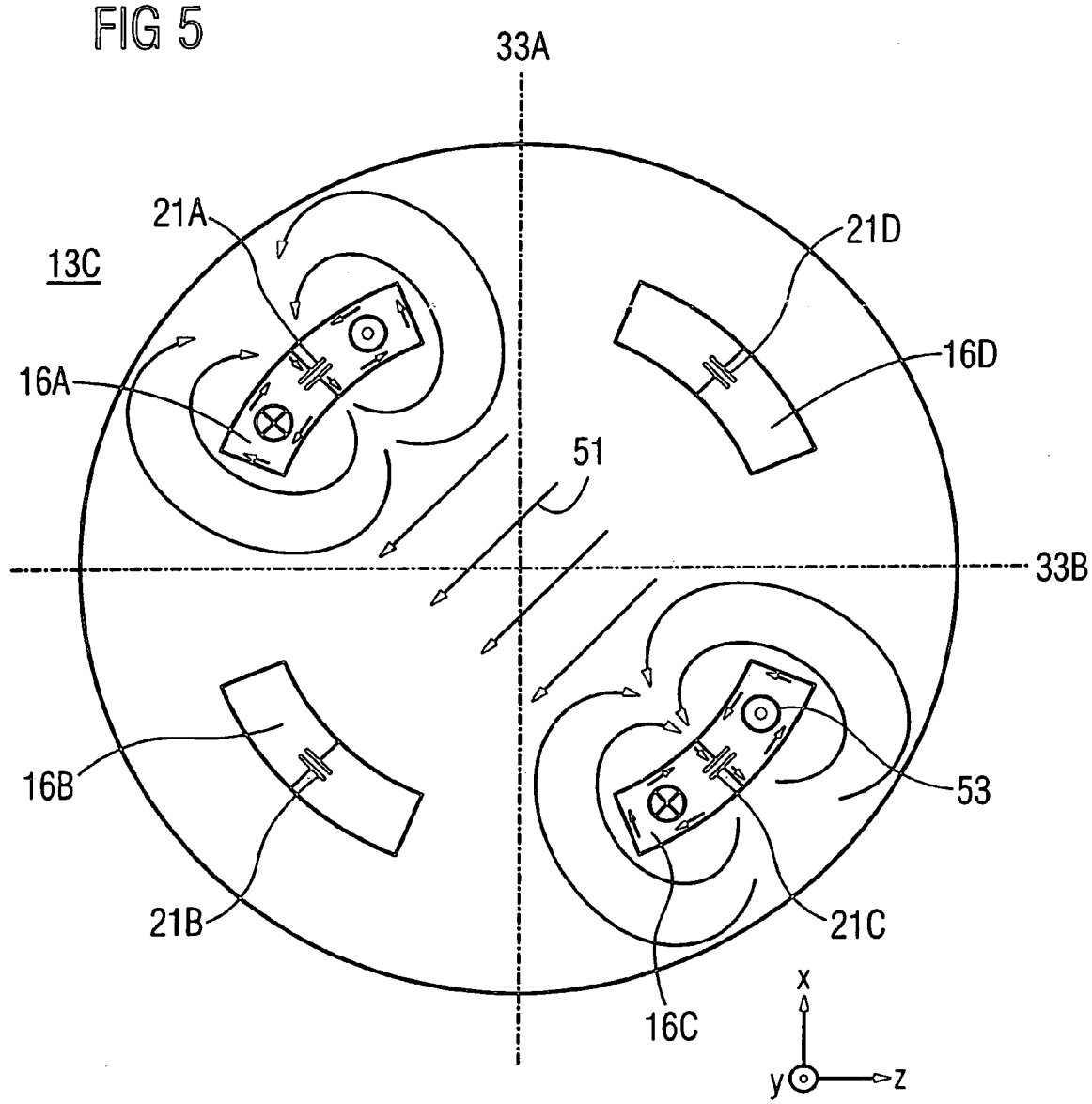

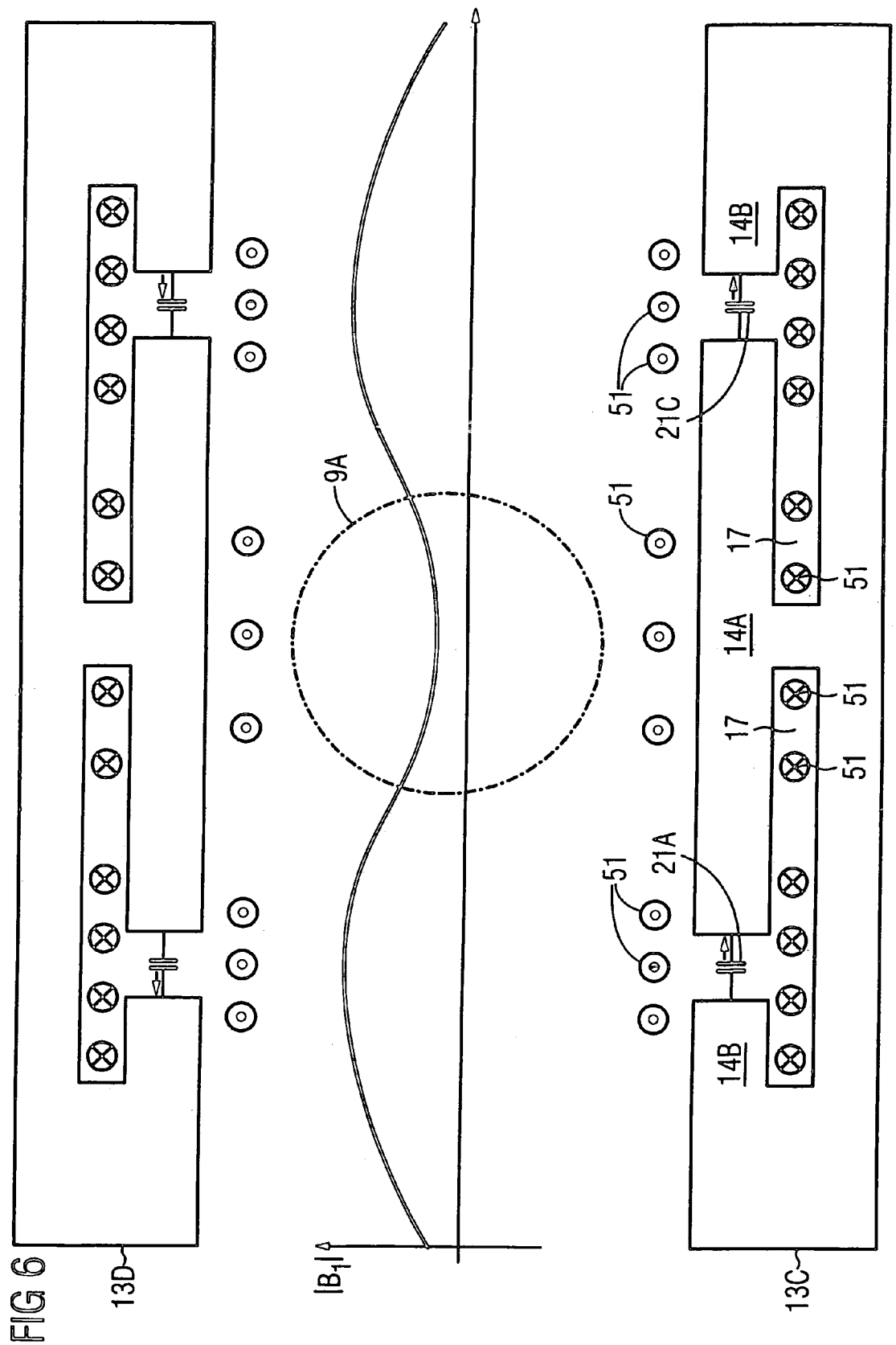

TIME-VARIABLE MAGNETIC FIELDS GENERATOR AND MAGNETIC RESONANCE APPARATUS EMBODYING SAME

BACKGROUND OF THE INVENTION

1. Field of the Invention

The present invention concerns a time-variable magnetic fields generator with a primary gradient coil unit for generation of a gradient magnetic field in an examination region of a magnetic resonance apparatus. Furthermore, the invention concerns a magnetic resonance apparatus with at least one such generator.

2. Description of the Prior Art

Magnetic resonance technology is a known technology to, among other things, acquire images of the inside of a body of an examination subject. Rapidly switched gradient magnetic fields generated by gradient coils are superimposed on an existing static basic magnetic field B0 that is generated by a basic field magnet in an examination region of the magnetic resonance apparatus (MR apparatus). To excite magnetic resonance signals, the magnetic resonance apparatus also has a radio frequency antenna (RF antenna) that radiates RF signals (known as the B1 field) into the examination subject. The resulting magnetic resonance signals can be acquired using this antenna or further local antennas and are processed into magnetic resonance images. The B1 field generally is generated by currents through a conductor.

For example, an open magnetic resonance apparatus with a C-shaped basic field magnet is known from U.S. Pat. No. 6,433,550. A patient volume of the magnetic resonance apparatus, in which the basic magnetic field of the magnetic resonance apparatus is generated in an optimally homogeneous manner, is disposed in the opening of the C-shaped basic field magnet. Furthermore, two pole plates are disposed at the two ends of the C-structure on which are disposed parts of a gradient coil system fashioned essentially planar in the direction towards the patient volume. As disposed at these locations are parts of an antenna system of the magnetic resonance apparatus, which are likewise fashioned essentially planar. Gradient coils for the aforementioned gradient coil system are described in detail in German OS 40 37 894 and German OS 19544779. Actively shielded gradient coils for MR apparatuses are, for example, known from German PS 44 22 781 and German PS 44 22 782.

An antenna arrangement for a magnetic resonance apparatus in which a basic magnetic field is established between two pole plates is also known from German OS 42 32 884. A sub-antenna into which a radio frequency signal is fed is arranged at each pole plate. Each sub-antennas is formed by a closed, grounded shield facing the respective pole plate and a laminar (think, flat) conductor structure disposed at a distance from the shield and essentially parallel thereto. Furthermore, from German OS 42 32 884 ills known that with basic field magnets formed by pole plates it is attempted to keep the pole plate separation optimally small so that the weight of the basic field magnet remains small and a better basic magnetic field homogeneity is achieved. For this reason, it is advantageous to keep all internal components between the pole plates (such as the gradient coil system, the radio frequency shield and the antenna arrangement) as thin as possible. This competes with the fact that an optimally large separation of the antenna arrangement from the radio frequency shield is advantageous for a higher degree of efficiency of the specified antenna arrangement. This is particularly true given the use of the antenna arrangement to receive magnetic resonance signals.

A circular, planar radio frequency antenna for open magnetic resonance apparatuses is known from German OS 101 24 737. It has two separated systems made of planar conductors arranged on a carrier plate for intercrossing currents. For tuning to the desired resolution frequency, the conductors are capacitively shorted on at least one end by tuning capacitors connected to ground. Only one planar metal layer is arranged on each carrier plate, into which metal layer both currents, phase-offset by 90°, are fed. Tuning capacitors are arranged at the feed location and the opposite side.

Generally in magnetic resonance systems the dimension of the volume within which the homogeneous basic magnetic field B0 is homocieneous, i.e. the pole plate separation, are a primary factor in the overall apparatus cost and therefore this volume is not made any larger than necessary. Thus measures to minimally occupy the available space with internal components or to maximally use the available space for the patient for comfortable examination are advantageous.

SUMMARY OF THE INVENTION

An object of the present invention is to provide a time-variable magnetic field generator and a magnetic resonance apparatus with such a generator that, with a high efficiency, exhibit an optimally compact design, in particularly with regard to gradient coil units and radio frequency antennas.

The above object is achieved by a generator of the initially described type with a primary gradient coil unit wherein the primary gradient coil unit for acquisition of at least one gradient coil conductor has a central region, an outer region and at least one connecting region connecting the two regions, the outer region surrounding the central region, and wherein at least one intervening space (interstice) that is free of the gradient coil conductor of the primary gradient coils and in which a radio frequency antenna element is disposed, exists between the central region and the outer region.

An advantage of the invention is that the conductor runs of the primary gradient coil unit do not necessarily have to occur connected as a coil winding in the central region; rather, a closure of coil windings can ensue outside of the central region over the connecting region. The generation of gradient magnetic fields is thereby more efficient since a return of the conductor can ensue at a greater distance, and thus the generation of magnetic fields that counteract the gradient magnetic field is reduced. The larger the connecting region, the more coil windings can be closed outside of the central region and the more efficient the generation of the gradient magnetic field. A further advantage is that the intervening space is used to form an RF antenna by means of the RF antenna elements. This enables a very compact design of the gradient coil unit and the RF antenna. Such a generator designed as a gradient coil radio frequency antenna unit exhibits a high degree of integration of gradient control unit and radio frequency antenna unit. High requirements of the gradient field can be fulfilled with one or more connection regions. The efficiency of the RF antenna, particularly the curve of the RF field, is impaired by the limitation of the antenna elements to the intervening spaces. The latter can, be compensated, for example, by stronger RF transmitters and contrast-improved MR measurement sequences.

The above object also is achieved by a magnetic resonance apparatus with at least one such generator. A larger examination region is available to the patient given the use of such a generator, in particular in open MR apparatuses.

For example, the magnetic resonance apparatus is based on a C-shaped permanent magnet with, for example, a vertical basic magnetic field. The basic magnetic field lies between two opposite pole plates and is optimally homogenous in the examination region of the magnetic resonance apparatus. If an inventive generator is arranged at each pole plate, a gradient magnetic field can be efficiently generated in the examination region.

In a particularly advantageous design of the generator, the regions of the primary gradient coil unit complement one another in an essentially plate-like manner, i.e. the regions lie in the same surface. The surface can thereby be planar or curved, adapted to the examination region.

In an embodiment of the generator, the central region is circular, the outer region is annular and the connecting region is fashioned like a spoke. This embodiment has the advantage that the geometry of the gradient control unit is particularly advantageously adapted to cylindrically symmetrical basic magnetic fields of C-arm-shaped magnetic resonance apparatuses. Alternatively, the regions can be fashioned as rectangles.

In a further embodiment of the generator, the gradient coil unit has a number of gradient coil conductors that can be fed with current individually or together. One of the gradient coil conductors runs from the outer region to the central region over a first of the connecting regions and back again to the outer region over a second of the connecting regions. Given the closure of the gradient coil windings, a section of a gradient conductor conducting a return current can be displaced radially outwardly in the outer region in this manner.

Alternatively, a section of a gradient conductor conducting a return current can be used as a shield conductor for shielding from magnetic fields of the first gradient coil unit outside of the examination region. For example, for this purpose one of the gradient coil conductors exits the outer region at one position in the direction of the side facing away from the examination region and subsequently runs to another position of the outer region and enters into this outer region again, on the side of the primary gradient control unit facing away from the examination region.

In another embodiment of the generator, this comprises a field reflux volume located on the side of the primary gradient coil unit facing away from the examination region, and the intervening space connects the field reflux volume and the examination region with one another such that the time-variable magnetic fields proceed in the intervening space, in the field reflux volume and in the examination region. The intervening space, the field pressure flow chamber and the examination region preferably are fashioned such that they enable a reflux of gradient magnetic fields and radio frequency magnetic fields. The use of such a field reflux volume enables a very compact design of a gradient coil unit combined with a radio frequency antenna with high efficiency.

The regions of the primary gradient control unit preferably are individually enclosed by sections of an electrical conductor acting as a radio frequency shield. Such a radio frequency shielding reduces losses by preventing the interaction of the radio frequency field with the gradient coils. The electrical conductor preferably is interrupted and interconnected with capacitors such that it develops no significant eddy currents in the frequency range of the gradient signals, forming an essentially continuous conductor area in the range of the magnetic resonance frequencies.

In an embodiment of the generator, the electrical conductor or a partial region of the electrical conductor is part of a radio frequency antenna resonant circuit that additionally has at least one of the RE antenna elements, which in particular connects the section of the electrical conductor around the outer region with the section of the electrical conductor around the central region in a radio frequency manner. The electrical conductor preferably serves as a type of return current conductor of the RE antenna resonant circuit. It is additionally advantageous when the electrical conductor surrounds the reflux volume up to the region at which it abuts the intervening space, and thus limits the region within the generator that can be occupied by the RE field.

In another advantageous embodiment of the generator, the antenna element has a unit to feed a radio frequency signal for generation of a radio frequency magnetic field and/or for readout of a magnetic resonance signal.

In another embodiment of the generator, four symmetrically arranged connecting regions are provided such that four intervening spaces are formed with at least one antenna element in each. Such a gradient coil unit is, for example, assembled from four similar 90° angle segments. Two opposite connecting regions preferably respectively accommodate gradient coil conductors for gradient field generation for a transverse direction. If a higher-quality gradient field is required in only one transverse direction, the generator could be reduced to only two connecting regions and, correspondingly, two intervening spaces.

In another embodiment of the generator, a secondary gradient coil unit is additionally present that is disposed on the side of the boundary surface of the field pressure flow chamber facing away from the examination region. The secondary gradient coil unit is fashioned to shield the primary gradient coil unit. This has the advantage that distortions of the desired spatiotemporal gradient magnetic field can be prevented by eddy currents or hysteresis effects.

DESCRIPTION OF THE DRAWINGS

FIG. 5 schematically illustrates generation of a B1 field.

FIG. 6 illustrates the B1 field curve.

DESCRIPTION OF THE PREFERRED EMBODIMENTS

Figure 1:
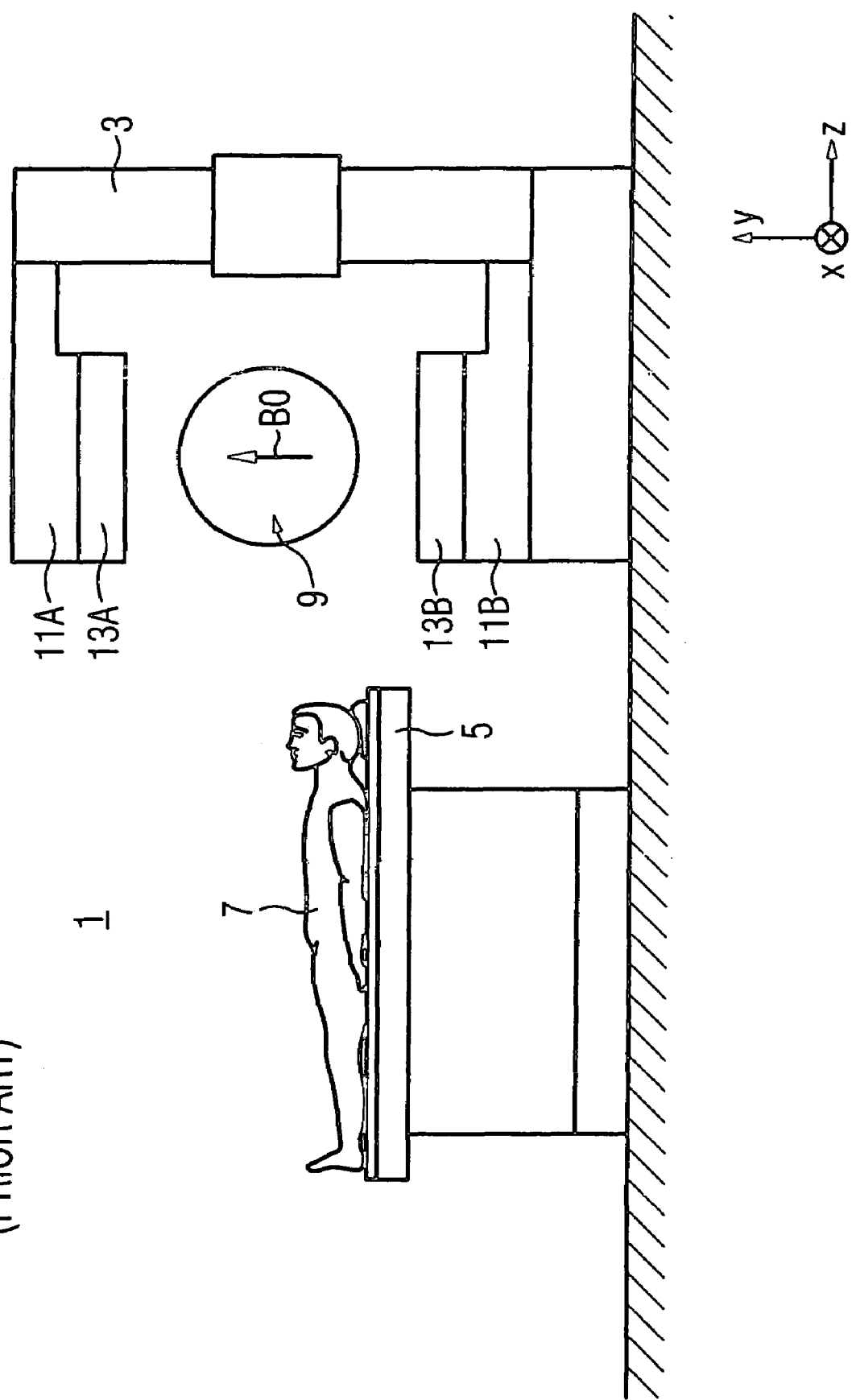
FIG. 1 schematically illustrates a magnetic resonance apparatus with a C-shaped basic field magnet and two gradient coil units.

FIG. 1 schematically shows an open magnetic resonance apparatus 1 for medical examination of patients, for example by means of MR tomography or MR spectroscopy in a basic magnetic field B0 that is generated with a C-shaped basic field magnet 3. The temporally constant B0 field is generated in the y-direction corresponding to the specified coordinate system and, for example, is approximately 0.3 T. Furthermore, a patient bed 5 with which a patient 7 can be introduced into the examination region 9 is schematically shown.

In the examination region 9, two time-variable magnetic fields generators 13A, 13B adapted to pole elements 11A, 11B of the basic field magnet 3 generate gradient fields and generate B1 radio frequency fields that are aligned perpendicular to the basic magnetic field B0. The generators 13A, 13B thus represent gradient coil units with integrated RF antenna units (gradient coil radio frequency antenna units) and enable a spatially resolved MR image acquisition. The generators 13A, 13B exhibit the inventive features. Depending on the design of the MR apparatus 1, it may be necessary to actively shield only one (typically the vertical) or more spatial directions. Modern gradient coil units typically have three primary gradient coils for generation of gradient magnetic fields in three orthogonal spatial directions as well as three corresponding secondary gradient coils for generation of magnetic fields that actively counter the primary gradient fields outside of the examination region 9.

A gradient coil typically has one or more gradient coil conductors fashioned as gradient coil windings. Each is fed with current for magnetic field generation. A gradient coil winding typically has regions that essentially generate the desired gradient magnetic field as well as regions with return conductors that are necessary for winding of the conductor. The further that the latter can be separated from the conductor regions generating the desired gradient magnetic field, the less the magnetic field of the returning conductor in the examination region 9 influences the desired magnetic field and the more efficiently the basic magnetic fields can be generated. Examples for various gradient coil windings for various spatial directions are known from the above patent documents. Interconnections of primary and secondary gradient coils are also possible.

For example, the pole elements 11A, 11B and therewith also the generators 13A, 13B have a diameter in the range of the examination region 9. In order to ensure an optimally ample patient comfort via an optimally open MR apparatus 1, the generators 13A and 13B exhibit an optimally high degree of structural integration of gradient coil(s) and RF antenna.

Figure 2:
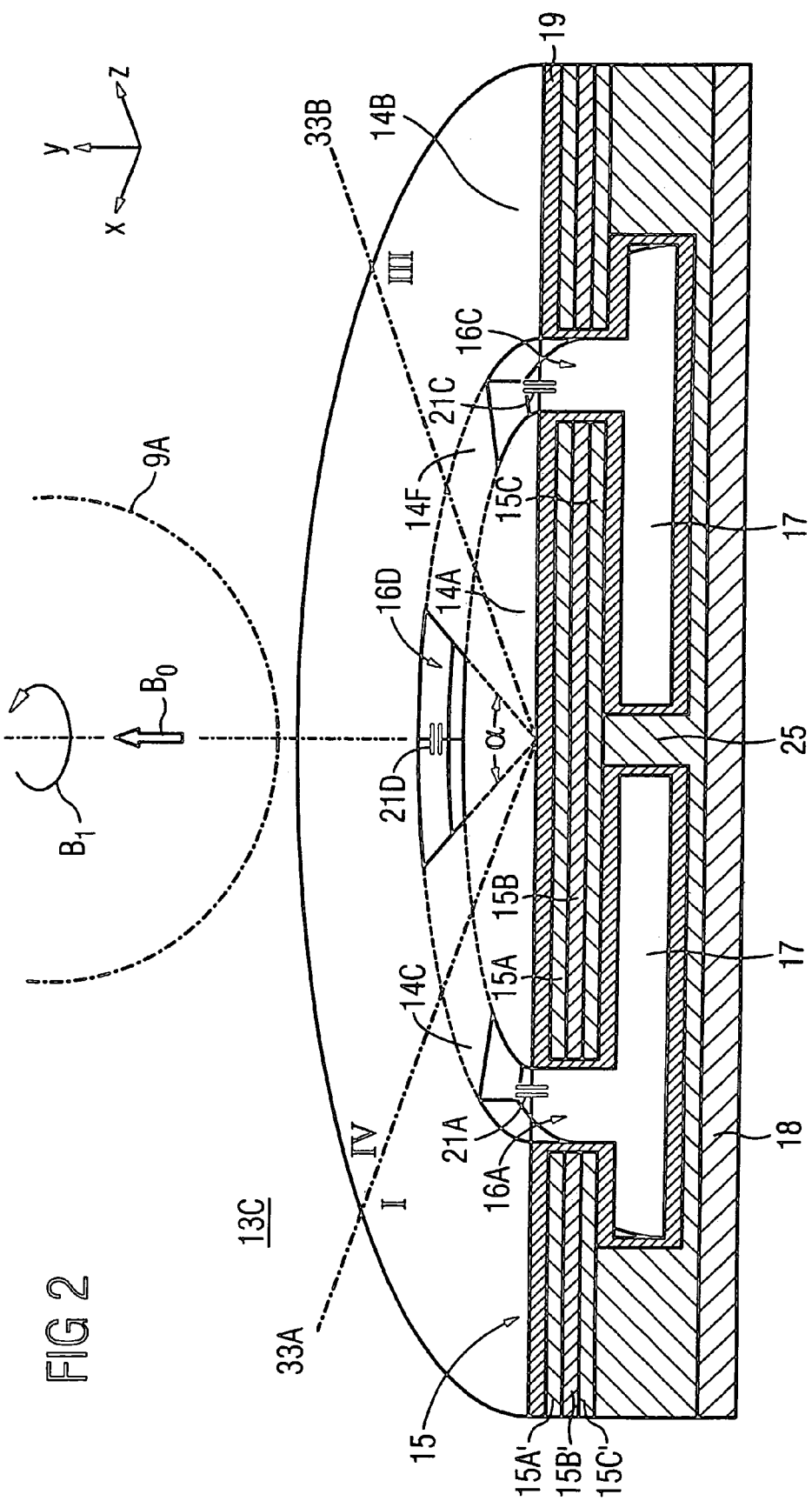
FIG. 2 is a section through an exemplary inventive gradient coil unit with a primary and a secondary gradient coil unit with a number of primary and secondary gradient coils as well as with integrated radio frequency antenna.

As an exemplary embodiment of the invention, FIG. 2 shows a section through a half of an inventive generator 13C shown in perspective. Such a gradient coil RF antenna unit 13C is particularly suitable for use in an open MR apparatus as shown in FIG. 1. For example, the shown gradient coil RF antenna unit 13C can be used at the lower pole element 11B of the C-shaped basic field magnet 3 of the magnetic resonance apparatus 1 from FIG. 1 and a further identical gradient coil RF antenna unit rotated by 180° can be used at the upper pole element 11A.

The shown gradient coil RF antenna unit 13C has a disc-shaped central region 14A, an outer region 14B annularly surrounding the central region 14A and a number of connecting regions 14C, 14F. These regions commonly form a plate-shaped primary gradient coil unit 15. Gradient coil conductors run in the various regions for the gradient field generation in three spatial directions. Electrical conductor regions 15A, . . . 15C are arranged in the region 14A and electrical conductor regions 15A', . . . 15C' are arranged in the region 14B of the primary gradient coil unit 15 for three spatial directions (x-, y-, z-gradient coils). The connecting regions 14C, 14F represent a gradient conductor-guiding connector between the central region 14A and the outer region 14B.

A secondary, likewise disc-shaped gradient coil unit 18 is disposed parallel to the primary gradient coil unit 15 on the side facing away from an examination region 9A. The magnetic field generated by conductors of the secondary gradient coil unit 18 shields the primary gradient magnetic field, for example in the region of a metal housing of a pole plate, in order to prevent unwanted eddy currents and interfering magnetic fields associated therewith. The thicknesses of the primary and secondary gradient coil units 15, 18 are, for example, approximately 2 cm.

Furthermore, it is advantageous to provide a region in the generator 13C for accommodation of parts of a passive shim system and/or of a cooling system. In particular a shaft-like region 25 connecting the centers of the gradient coil units 15, 18 enables an electrical connection with conductors arranged in the central region 14A or the supply of a cooling system arranged therein for cooling of the gradient conductors. This is possible without the necessity of radio frequency feedthroughs due to the unjacketed design of an RF-shielding electrical conductor 19 described in the following.

Symmetry lines 33A, 33B divide the generator 13C into four similar angle segments I, . . . IV. Each of the angle elements I, . . . has an intervening space 16A, . . . that extends over an angle α between the central region 14A and the outer region 14B. The four intervening spaces 16A, . . . are annularly arranged around the central region 14A, with the ring being interrupted by the connecting regions 14C, . . . The intervening spaces 16A, . . . act as an opening and access for a field reflux volume 17 lying on the side facing away from the examination region 9A and forming an undercut with regard to the intervening spaces 16A, . . . Radio frequency antenna elements 21A, . . . are disposed in the intervening spaces 16A, which radio frequency antenna elements 21A, . . . are part of an RE antenna resonant circuit that is used for generation of RE magnetic fields and for reception of MR signals. The antenna elements 21A, . . . are schematically shown via longitudinal capacitors representing correspondingly elaborate RE circuits. The RE circuits enable tuning of the resonance frequency as well as feed and readout of RF signals.

The already mentioned electrical conductor 19 acting as an RE shield surrounds the primary gradient coil unit 15 and internally lines the walls of the field reflux volume 17. It is preferably interrupted and/or interconnected with capacitors such that it develops no significant eddy currents in the frequency range of the gradient signals, but essentially acts as a continuous conductor surface in the range of the MR frequencies and thus prevents a penetration of RE fields into the gradient coil units 15, 18. For this purpose, the radio frequency shield 19 can be formed, for example, by a number of layers of electrically conductive foil in a known manner that are fashioned with capacitively bridged slots. For example, the thickness of the conductor 19 lies is approximately 15 µm.

The primary gradient coil unit 15 can have an arbitrary shape deviating from the illustrated cylindrical symmetry. The design of the primary gradient coil unit 15 as a circular plate, as shown in FIG. 2, is particularly advantageous in open MR systems in which both pole plates of the magnets are realized by opposite, circular plates.

Figure 3:
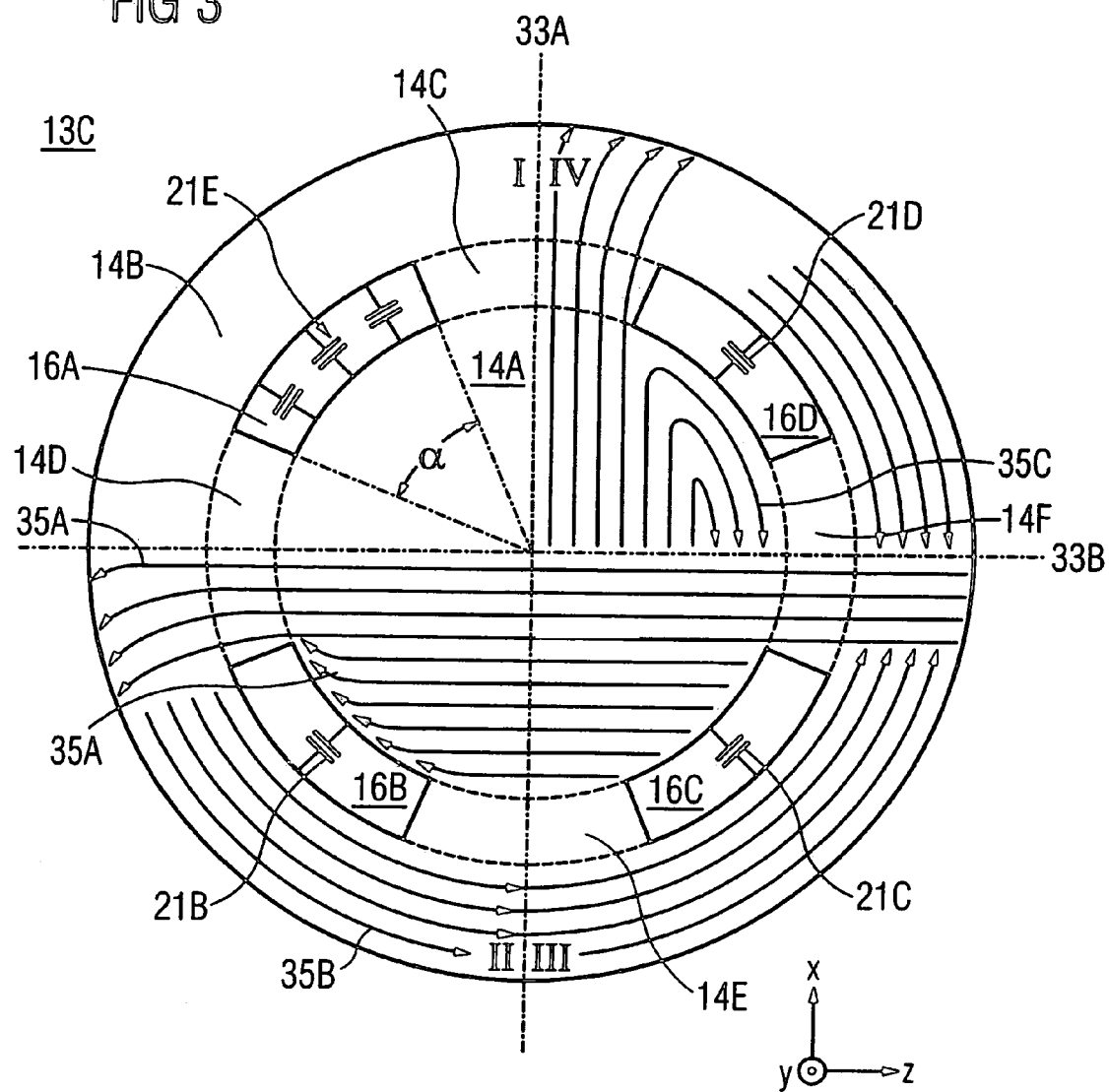
FIG. 3 is a view on the side of the primary gradient coil, of the gradient coil unit from FIG. 2 for explaining possible conductor arrangements of the primary gradient coils, FIG. 4 schematically illustrates generation of a gradient field in the x-direction.

For explaining possible gradient conductor arrangements, on the side of the primary gradient coil FIG. 3 shows a view of the generator 13c from FIG. 2. The division into four similar angle segments I, . . . IV is again recognizable, in which, for example, the intervening spaces 16A, . . . respectively extend over an angle of α=45°. This is clarified in the angle segment I. One or more antenna elements can be arranged in the intervening spaces 16A, . . . In addition to a single antenna element, arrangements are particularly advantageous that allow the feed of a single antenna element 21A, . . . As an example, an arrangement of three RF antenna elements 21E has been indicated in the intervening space 16A that allow feed of an RF signal to the middle antenna element of the RF antenna elements 21E due to the symmetrical arrangement.

A half of a gradient conductor arrangement for a gradient field generation in the x-direction is schematically specified in the angle segments II and III. Gradient conductors 35A run in the z-direction from one side of the outer region 14B over the connecting region 14F, the central region 14A, the connecting region 14D and back to the outer region 14B. The gradient field generation primarily ensues via the conductors 35A directed parallel to one another in the central region 14A.

Due to the spoke-like arrangement of the connecting regions 140, . . . , necessary return conductors 35B can be shifted further radially outwardly into the outer region 14B. Alternatively, some or all recirculations of the gradient conductors 35A can be used as shield coil conductors of the secondary gradient coil unit 18. This is accomplished by interconnection of the conductors with the plane below the primary gradient coil unit 15 at the edge of the outer region 14B.

The course of the total gradient coil winding is obtained via mirroring of the gradient conductors 35A, . . . at the line of symmetry 33B.

In a further embodiment, gradient conductors also close within the central region 14A. This is schematically indicated by the conductors 35C in the angle segment IV. However, this has the disadvantage that the return conductors lying further outwardly in the central region counteract the gradient field generation. However, since the coil windings do not have to be closed for all gradient conductors within the central region 14A due to the connecting regions, in the central region 14A there is a reduced number of return conductors that counteract the gradient field to be achieved.

A gradient coil winding for generation of a gradient magnetic field in the z-direction is obtained via rotation of the arrangement by 90°. The connecting regions 14C and 14E are correspondingly used for conductor accommodation. The gradient conductors for the x- and z-direction are preferably located in different planes, at least in the central region 14A.

A gradient coil winding for a gradient magnetic field in the y-direction is significantly based on a conductor structure running in a spiral shape that can be accommodated both by the central region 14A and by the outer region 14B.

Since in general the size of the intervening spaces 16A, . . . is proportional to the sensitivity of the radio frequency antenna, trade-offs can be made between the capability of the radio frequency antenna and the gradient coils by tuning the size ratios of the intervening spaces 16A, . . . to the connecting regions 140, . . . A reduced transmission capability can be compensated by a larger RE amplifier, whereas the geometry of the gradient conductor arrangement is directly involved in the spatial resolution. The requirements of the gradient coil design can be more easily met by the connecting regions 14C . . . .

If only a single transverse gradient coil of the type described above is used, for example only two opposing connecting regions 14C are required and larger intervening spaces 16A, . . . are available for the radio frequency field generation. The gradient coil conductors 35A, . . . of the primary gradient coil 15 are arranged in the three spatial directions X, Y and Z in parallel planes in FIG. 2. In order to enable a change of the gradient coil conductors from the primary gradient coil 15 to the secondary gradient coil 18 in the outer region 14B, the outer region 14B is connected with the secondary gradient coil 19 in the boundary region. For example, this connection exhibits a thickness of two gradient conductor layers of approximately 4 mm.

Figure 4:
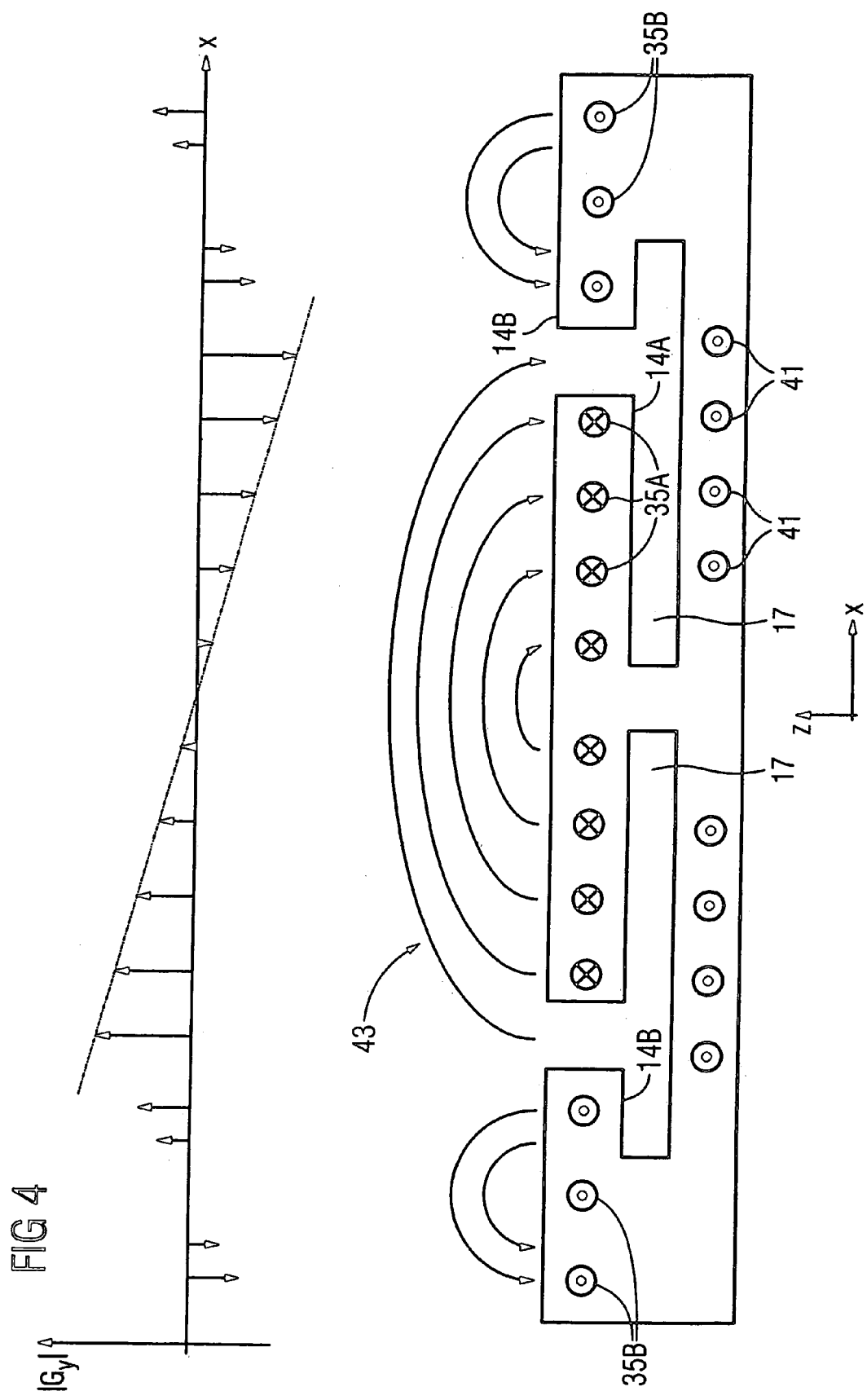

FIG. 4 schematically shows a spatial curve of a gradient field as generated with an arrangement of gradient conductors corresponding to the angle segments II and II from FIG. 4. The gradient conductors 35A that run perpendicular to the line of symmetry 33A in the central region 14A, the gradient conductors 35B in the outer region 14B and conductors 41 of the secondary gradient coil unit 18 are recognizable in FIG. 4 in the section along the line of symmetry 33A. The connecting regions 14C and 14E that are not necessary for the gradient conductor arrangement are not shown. If a gradient coil of the primary gradient coil 15 is generally fed with current, a gradient magnetic field forms that superimposes in the respective spatial direction with the basic magnetic field B0 within the examination region 9A. If the corresponding gradient coil of the secondary gradient coil 18 is simultaneously fed with current, this significantly compensates the gradient field of the primary gradient coil unit 15 outside of the examination region 9A. For this purpose, for example, the current in the gradient conductors 35A flows in the opposite direction in comparison with the current in the gradient conductors 35B and in the secondary conductors 41. The symbol ⊙ designates a current exiting from the plane of the drawing at this point, and the symbol designates a current entering into the plane of drawing at this point. A gradient magnetic field 43 is indicated in FIG. 4 at a point in time corresponding to the shown current directions. The magnetic field lines of the gradient magnetic field 43 close via the field pressure flow chamber 17.

The amplitude curve of a y-component $G_y$ of the gradient magnetic field 43 in the x-direction is likewise shown in FIG. 4 in the example of a negative gradient: with increasing x-value, the gradient field $G_y$ decreases and the direction changes centrally. For generation of an optimally linear gradient field $G_y$, it is advantageous to use two opposite generators.

FIGS. 5 and 6 serve for clarification of the function of the generator 13C as an RF antenna with which a B1 field can be generated and with which magnetic resonance signals can be received. FIG. 5 explains the mode of operation using the current flow in the generation of a B1 field, and FIG. 6 schematically illustrates the B1 field curve belonging to this.

The central components of the RF antenna are the RF antenna elements 21A, . . . that respectively bridge the intervening spaces 16A, . . . in the form of a disc. Together with regions of the electrical conductor 19 acting as a radio frequency shield, they form the RF resonator. An RF signal is fed at each of the RF antenna elements 21A, . . . In FIG. 5, it has been assumed that at this point in time a current only flows in the RF antenna elements 21A and 21C. For example, this corresponds to the point in time of maximal current in the RF antenna elements 21A and 21C and no current in the RF antenna elements 21B and 21D. This also corresponds to the situation given the generation of a linear B1 field with two opposite RF antenna elements.

For example, for generation of a (circular) B1 field rotating around the direction of the basic magnetic field B0, the RF antenna elements 21A and 21C are fed with an RF signal phase-offset to the RF antenna elements 21B and 21D.

The significant current flows to the regions of the electrical conductor 19 that line the intervening spaces 16A, . . . These walls form a type of return current conductor in the RF resonator. The current direction of the feed at a fixed point in time and the associated current directions on the walls was respectively characterized with arrows. However, the current flow additionally (if possible) spreads over the entire electrical conductor 19. The current directions in both halves of the intervening spaces are mirror-symmetric to the axis of symmetry through the RF antenna elements 21A and 21D. Given such an excitation of two generators disposed mirror-symmetrically to one another, a magnetic field 51 whose field lines 53 close via the intervening spaces 21A, 21C and the field pressure flow chamber 17 is generated in the examination space 9A (i.e. between the generators). The symbol ⊙ characterizes a field line escaping from the plane of projection at this point, and the symbol ⊗ characterizes a field line entering into the plane of projection at this point.

Due to the phase relation of the excitation of both pairs of RF resonators, the circular B1 field results in the examination space 9A.

Two generators 13C, 13D disposed mirror-symmetrically to one another are drawn in FIG. 6 in a section through the opposing RF antenna elements 21A and 21C. Given a current feed according to FIG. 5, the B1 field 51 is established whose magnetic field lines exit from the plane of projection (symbol ⊙) between the generators 13C and 13D and enter into the plane of projection (symbol ⊗) in the field reflux volume 17 and thus close. An amplitude curve of the B1 field in the slice direction additionally is additionally, schematically shown in FIG. 6 as it exists centrally between the generators. It exhibits a maximum in the region of the RF antenna elements 21A, 21C, however is essentially constant in the examination space 9A.

The larger the angle that the connecting regions 140, . . . occupy, the most more powerful the gradient coils, however the capability of the RF antenna decreases since it is dependent on the size of the intervening spaces. A ratio of the sizes of the intervening space and the connecting region adapted to the requirements is determined by a trade-off between the gradient performance and the radio frequency performance of the generator.

Although modifications and changes may be suggested by those skilled in the art, it is the intention of the inventors to embody within the patent warranted hereon all changes and modifications as reasonably and properly come within the scope of their contribution to the art.

We claim as our invention:

1. A time-variable magnetic fields generator for generating a gradient magnetic field in an examination volume of a magnetic resonance apparatus, comprising:
   a primary gradient coil unit having a central region, an outer region surrounding and separated from said central region by an intervening space, and at least one connecting region proceeding through said intervening space and connecting said central region and said outer region, with at least one gradient coil conductor proceeding through said central region, said outer region and said at least one connecting region, said at least one gradient coil conductor being adapted to be fed with current to generate a time-variable magnetic field;
   at least a portion of said intervening space between said central region and said outer region being free of any gradient coil conductor; and
   a radio frequency antenna element disposed in said portion of said intervening space that is free of any gradient conductor.

2. A generator as claimed in claim 1 wherein said central region, said outer region and said at least one connecting region are disposed substantially co-planar.

3. A generator as claimed in claim 1 wherein said central region is a circular region and wherein said outer region is an annular region, and wherein said at least one connecting region forms a spoke between said circular central region and said annular outer region.

4. A generator as claimed in claim 1 wherein said primary gradient coil unit comprises a plurality of gradient coil conductors each having individual conductor terminals adapted to feed the respective gradient coil conductors with current.

5. A generator as claimed in claim 4 wherein said primary gradient coil unit comprises a plurality of connecting regions, and wherein one of said gradient coil conductors proceeds from said outer region through a first of said connecting regions to said central region, and through a second of said connecting regions back to said outer region.

6. A generator as claimed in claim 1 wherein said primary gradient coil unit is adapted for installation in a magnetic resonance apparatus having an examination volume, with a side of said primary gradient coil unit facing said examination volume, and wherein said gradient coil conductor exits said outer region at a first location at said side and proceeds to a second location at said side and enters said outer region again at said second location.

7. A generator as claimed in claim 1 wherein said primary gradient coil unit is adapted for installation in a magnetic resonance apparatus having an examination volume, with a side of said primary gradient coil unit facing said examination volume, and wherein said at least one intervening space is disposed in said side of said primary gradient coil unit adapted to face said examination volume, and wherein said primary gradient coil unit contains a field reflux volume communicating with said portion of said intervening space, and wherein said gradient coil conductor generates said time-variable magnetic field in said intervening space, said field pressure flow chamber and said examination volume.

8. A generator as claimed in claim 1 wherein said primary gradient coil unit comprises an electrical conductor functioning as a radio frequency shield.

9. A generator as claimed in claim 8 wherein said primary gradient coil unit is adapted for installation in a magnetic resonance apparatus that operates at a magnetic resonance frequency, and wherein said electrical conductor is in electrical connection with at least one capacitor to substantially prevent said electrical conductor from generating eddy currents in a frequency range of current in said at least one gradient coil conductor, while behaving as a continuous conductor surface in a range of said magnetic resonance frequency.

10. A generator as claimed in claim 8 wherein said electrical conductor individually, respectively encloses said central region, said outer region and said at least one connecting region of said primary gradient coil unit.

11. A generator as claimed in claim 10 wherein said magnetic resonance apparatus in which said primary gradient coil unit is adapted for installation has a radio frequency antenna resonant circuit, and wherein said electrical conductor has a first section around said outer region and a second section around said central region, and wherein said at least one of said antenna elements forms a radio frequency connection between said first and second sections of said electrical conductor.

12. A generator as claimed in claim 11 wherein said electrical conductor forms a return current conductor in said radio frequency antenna resonant circuit.

13. A generator as claimed in claim 1 wherein said primary gradient coil unit is adapted for installation in a magnetic resonance apparatus having an examination volume, with a side of said primary gradient coil unit facing said examination volume, and wherein said at least one intervening space is disposed in said side of said primary gradient coil unit adapted to face said examination volume, and wherein said primary gradient coil unit contains a field reflux volume communicating with said intervening space, and wherein said gradient coil conductor generates said time-variable magnetic field in said intervening space, said field pressure flow chamber and said examination volume said primary gradient coil unit further comprising an electrical conductor functioning as a radio frequency shield, said electrical conductor having a first section around said outer region and a second section around said central region and forming a boundary surface of said field reflux volume at a side of said primary gradient coil unit facing away from said examination volume, with said field pressure flow chamber bordered by said boundary surface and by said first section and said second section of said electrical conductor to close field lines of at least one of said time variable magnetic field and a radio frequency field generated by a radio frequency antenna resonant circuit of said magnetic resonance apparatus.

14. A generator as claimed in claim 1 wherein said antenna element comprises terminals allowing coupling of a radio frequency signal to said antenna element or coupling of a magnetic resonance signal received by said antenna element.

15. A generator as claimed in claim 1 wherein said primary gradient coil unit comprises four symmetrically disposed connecting regions and four intervening spaces respectively alternating with said four connecting regions.

16. A generator as claimed in claim 1 wherein said primary gradient coil unit is adapted for installation in a magnetic resonance apparatus having an examination volume, and wherein said primary gradient coil unit comprises a secondary gradient coil unit attached thereto at a side of said primary gradient coil unit facing away from said examination volume to shield against said time-varying magnetic field generated by said gradient coil conductor of said primary gradient coil unit.

17. A magnetic resonance apparatus comprising:
   a data acquisition unit having an examination volume adapted to receive an examination subject therein to acquire magnetic resonance data from the examination subject in the imaging volume; and
   a time-variable magnetic fields generator comprising a primary gradient coil unit having a central region, an outer region surrounding and separated from said central region by an intervening space, and at least one connecting region proceeding through said intervening space and connecting said central region and said outer region, with at least one gradient coil conductor proceeding through said central region, said outer region and said at least one connecting region, said at least one gradient coil conductor being adapted to be fed with current to generate a time-variable magnetic field, at least a portion of said intervening space between said central region and said outer region being free of any gradient coil conductor, and a radio frequency antenna element disposed in said portion of said intervening space that is free of any gradient conductor.

18. A magnetic resonance apparatus as claimed in claim 17 wherein said data acquisition unit comprises a C-shaped permanent magnet with two opposing pole plates for generating a basic magnetic field in said examination volume, said examination volume being disposed between said pole plates and each of said pole plates having a side facing away from said examination volume, and wherein said time-variable magnetic fields generator is a first generator and wherein said magnetic resonance apparatus comprises a second time-variable magnetic fields generator identical to said first generator, said first and second generators being respectively disposed on the sides of the respective pole plates facing away from said examination volume.

* * * * *